United States Patent [19]

Striplin

[11] Patent Number: 4,712,693
[45] Date of Patent: Dec. 15, 1987

[54] REMOTE CONTROL UNIT CONSOLE
[76] Inventor: James W. Striplin, 10095 Kinross Rd., Roswell, Ga. 30076
[21] Appl. No.: 885,198
[22] Filed: Jul. 14, 1986
[51] Int. Cl.⁴ ............................................. A47F 5/02
[52] U.S. Cl. ..................................... 211/164; 211/13; 211/99; 248/130; 248/185; 248/205.2
[58] Field of Search ............... 248/185, 176, 177, 349, 248/130, 205.2; 211/13, 164, 199; 269/56, 57; 273/148 B

[56] References Cited

U.S. PATENT DOCUMENTS

| | | | |
|---|---|---|---|
| 1,867,145 | 7/1932 | Godfrey | 211/164 |
| 2,962,156 | 11/1960 | Adams | 211/164 X |
| 3,054,589 | 9/1962 | Godsey | 248/185 |
| 3,248,790 | 5/1966 | Galloway et al. | 269/57 X |
| 4,157,760 | 6/1979 | Wilson | 211/13 |
| 4,478,382 | 10/1984 | Carrier | 248/185 |
| 4,480,809 | 11/1984 | Healey | 248/185 |

Primary Examiner—Ramon O. Ramirez
Attorney, Agent, or Firm—Jones, Askew & Lunsford

[57] ABSTRACT

A remote control console, comprising a base, and a remote control unit supporting member for supporting a plurality of remote control units which emit activating beams. The remote control unit supporting member is rotatably mounted to the base such that the activating beams of the attached remote control units may be selectively directed toward a common remote position.

15 Claims, 4 Drawing Figures

4,712,693

REMOTE CONTROL UNIT CONSOLE

FIELD OF THE INVENTION

The present invention generally relates to a supporting console for remote control units, and more particularly relates to such a console which supports a plurality of remote control units such that the units may be conveniently operated without removal from the console.

BACKGROUND OF THE INVENTION

In home entertainment, it is common to have an entertainment center which includes a variety of individual components, including such components as a television, cable television channel selection box, video cassette recorder, compact disc player, phonograph record player, AM/FM receiver, or an audio cassette player. It is also common to have remote control units which operate these components from a remote location, without physically contacting the corresponding component or having any connecting wiring between the remote control unit and the component.

Conventional remote control units include a plurality of pressure- or touch-sensitive switches arranged into a type of miniature keyboard. When one of these switches has been activated (normally by manually pressing them) the remote control emits a coded triggering beam which may be directed toward the home entertainment center. The corresponding component receives this beam and electronically converts the coded signal to an instruction to vary an operating characteristic of the entertainment center (for example, a television may be turned on or off). If a different switch is pressed, a different coded signal is emitted, and a different operating characteristic of the component may be altered (for example, a television channel).

Some entertainment centers, although composed of individual components, may be operated from a single remote control unit. However, a large majority of entertainment centers are composed of components obtained from a variety of manufacturers, of which each uses a different remote control coding system. Therefore, it may be necessary to have one remote control unit to control a television, a different remote control unit to control a video cassette recorder, and yet a different remote control unit to control a pay cable channel selection box. This is a disadvantageous inconvenience to the operator of the entertainment center.

It has been known to place two of such remote control units "back-to-back", such that the keyboard portions of the two units are outwardly and oppositely facing, yet the control beam emitting lenses are commonly oriented, and to wrap an elastic band around the resulting cluster. This allows the operator of the clustered combination to operate either of the two units by simply inverting the cluster and operating the desired remote control unit. However, this configuration is only suitable for a combination of two remote control units. Furthermore, when the cluster is placed on a tabletop, desk, etc., there is a risk that the switches on the downwardly-facing remote control unit will inadvertently be triggered.

Therefore there is a need for a device or method which will allow a plurality of remote control units to be easily stored and conveniently oriented for operation from a central location, without the risk of inadvertent triggering of the units.

SUMMARY OF THE INVENTION

The present invention solves problems in the prior art by providing a means for allowing a plurality of remote control units to be easily stored and operated from a central location, without the risk of inadvertent triggering of the units.

The invention is directed toward a device having a support base, and a rotating member configured for accepting a plurality of remote control units. By attaching the remote control units to the rotating member, an operator can easily access any of the remote control units by simply rotating the rotating member.

The device in general includes a device for supporting remote control units which emit activating beams, comprising a base, a remote control unit supporting means for supporting a plurality of remote control units, a connecting means operably associated with the base and the supporting means to allow the supporting means to be displaced relative to the base so that the triggering beams of each of the remote control units may be directed toward a common remote position without displacement of the base.

Stated somewhat more particularly, the remote control units are supported in a spaced-apart relationship such that the triggering beam of each of the remote control units is commonly oriented.

Thus, it is an object of the present invention to provide a central console for a plurality of remote control units.

It is a further object of the present invention to provide such a console which supports a plurality of remote control units such that the units may be conveniently operated without removal from the console.

It is a further object of the present invention to provide such a console which is inexpensive, lightweight, and simple to operate.

Other objects, features and advantages of the present invention will become apparent upon reading the following detailed description of the preferred embodiment of the invention, when taken in conjunction with the drawings and the appended claims.

DETAILED DESCRIPTION OF THE PREFERRED EMBODIMENT

Figure 1:
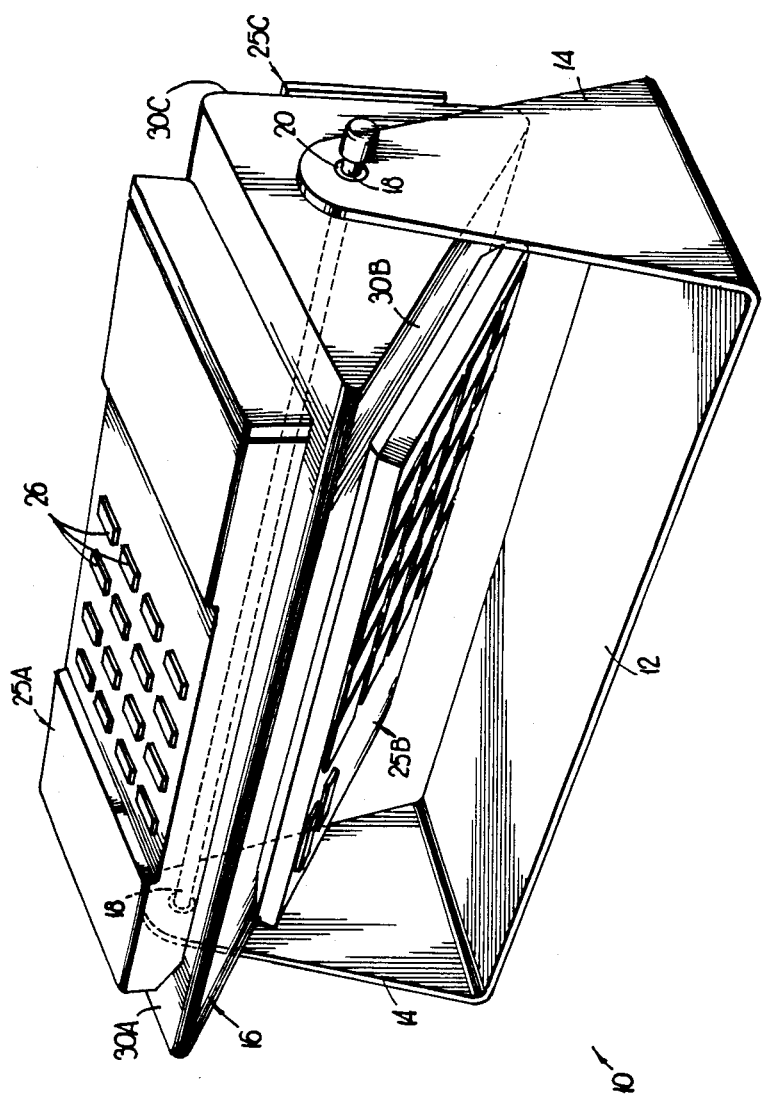
FIG. 1 is a pictorial view of a first preferred embodiment of the remote control unit console of the present invention.

Referring to the drawings, in which like numerals represent like parts throughout the several views, FIG. 1 shows the remote control unit console 10 including a base 12 having two upturned end flanges 14, a three-sided rotating member 16 having a central shaft 18, and shaft bearings 20. Typical remote control units 25A, 25B, and 25C are detachably mounted to the rotating member 16, as discussed in further detail later in this application.

The base unit 12 has a substantially horizontal planar floor portion, and has two substantially vertical planar end flanges 14. It willl be understood that any suitable arrangement could be used to support the shaft 18, including separate legs at either end of the rotating member 16. Furthermore, the shaft need not extend through the member 16. A bearing 20 is rigidly mounted within each of the flanges 14 such that the central axes of the bearing bores are substantially colinear and each such axis is normal to the planar surfaces of the end flanges.

The rotating member 16 of the preferred embodiment is elongate, and has a substantially isoceles-triangle shaped transverse outer cross section. The exterior of rotating member 16 defines three mounting surfaces 30A, 30B, and 30C, which accept and support the remote control units 25A, 25B, and 25C, respectively, as discussed in detail later in this application. The rotating member 16 may have a hollow interior, or may be solid throughout. The central shaft 18 passes through the longitudinal center of the rotating member 16 and extends outwardly from each end of the rotating member.

The remote control units 25A, 25B, and 25C are typical, and each includes a plurality of manually operable buttons 26 on a "top" side, which may be operated such that a triggering beam is emitted from a beam emitting lens 27 located at one "front" end of each unit.

When the remote control unit console 10 is assembled, each end of the central shaft 18 is rotatably mounted within one of bearings 20 such that the shaft may rotate within the bearings and relative to the base when a force is applied, but some resistance to turning is encountered by the shaft. Thus, the bearing preferably acts as a clutch. One example of a preferred bearing or clutch member which holds the rotating member in any position until changed by the operator is a rubber grommet tightly fitting the shaft 18.

The remote control units 25A, 25B, 25C, are attached to the mounting surfaces 30A, 30B, 30C, by a fastening configuration such as that associated with the "Velcro" trademark. This configuration utilizes one material having a surface composed of a series of flexible hooks, and a second material composed of a series of flexible loops. When the two surfaces are placed in contact, the flexible hooks engage the flexible loops, and thus provide a releasable bond.

Figure 2:
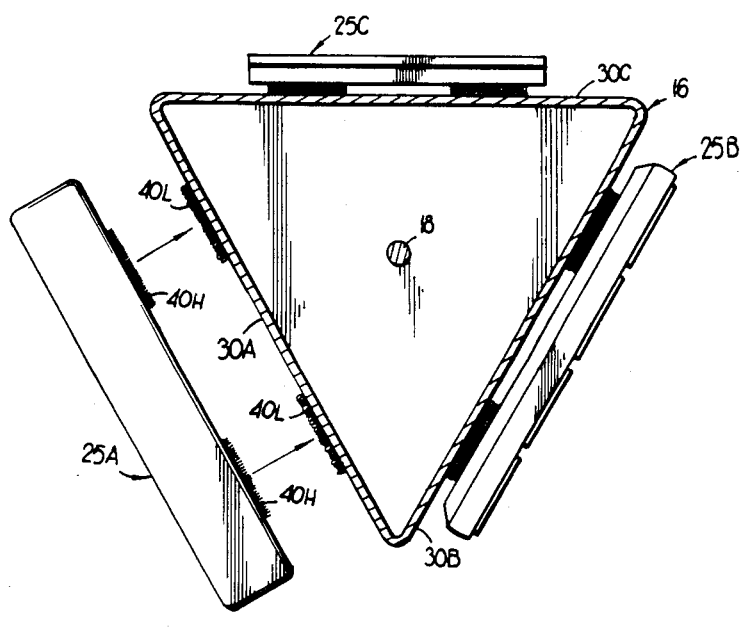
FIG. 2 is a transverse sectional view of the longitudinal rotating member of FIG. 1, illustrating the selectively attachable relationship between the rotating member and the remote control units.

Referring now to FIG. 2, the use of the "Velcro"-type releasably mating material is shown. Releasably mating hooked material 40H is attached to the undersides of the remote control units 25A, 25B, 25C, by gluing or other means known in the art. Releasably mating looped material 40L is similarly attached to each of mounting surfaces 30A, 30B, 30C, such that the remote control units 25A, 25B, 25C, may be placed upon the rotating member 16, and such that the beam emitting lenses 27 of the remote control units are commonly oriented and parallel to the longitudinal axis of the rotating member.

Therefore it may be seen that a selectively detachable connection is provided between the remote control units 25A, 25B, 25C, and the mounting surfaces 30A, 30B, 30C, of the rotating member 16, which allows the remote control units to be selectively attached to the rotating member such that the beam emitting lenses 27 are commonly oriented. It should also be understood that the positions of the looped material 40L and the hooked material 40H may be reversed, that is, the looped material may be attached to the remote control units 25A, 25B, 25C, and the hooked material may be attached to the mounting surfaces 30A, 30B, 30C, to provide an equally effective detachable bond between the remote control units and the rotating member 16.

It may be seen that the remote control units mounted upon the central rotating member may be of different configurations and weights, which could cause the rotating member to be statically unbalanced, and tend to rotate to its statically stable rotational position, which could be disadvantageous to the operator. However, the previously discussed "clutched" configuration provides adequate resistance to rotation of an unbalanced central rotating member, such that the rotating member does not rotate due to its own static instability, but only in response to movement by an operator, as discussed in detail below.

Operation of the remote control unit console 10 and the attached remote control units 25A, 25B, 25C, is now discussed. The base 12 of the remote control unit console 10 is positioned on a sufficiently flat surface such that the triggering beams of the remote control units are directed toward an entertainment center (not shown) including components remotely controlled by the remote control units. It should be understood that the triggering beams normally do not have to be directly aimed at each of their corresponding components but only in that general direction, as the triggering beams tend to "fan" out somewhat. The rotating member 16 is rotated so that the control buttons of the desired remote control unit are accessible. The operator then operates the remote control member as previously discussed. The operator may then rotate the rotating member 16 to access a different remote control unit. As all units are commonly oriented, it may be seen that no movement of the base 12 of the remote control unit console 10 is necessary during rotation of the rotating member 16.

Figure 3:
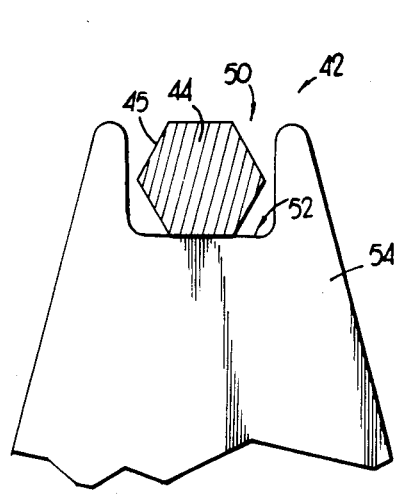
FIG. 3 is a partial end plan view of a first alternative bearing configuration between an alternative rotating shaft of the rotating member and alternative flanges of the base.

Referring now to FIG. 3, a first alternative embodiment 42 of the remote control unit console of the present invention includes a central shaft 44 having a hexagonal transverse cross section, and defining six contact facets 45 about its outer circumferential surface. When in its installed position, one of the contact facets 45 of the central shaft 44 rests upon horizontal ridges 52 in throats 50 defined by each of a pair of modified end flanges 54. The shaft 44 (and attached rotating member and remote control units) may be rotated such that a different contact facet 45 rests upon the ridges 52. Therefore it may be seen that the first alternative embodiment of the central shaft 18 allows the rotating member to be positioned in six relatively stable operating positions.

Figure 4:
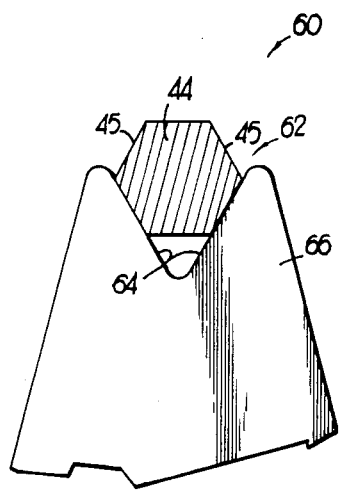
FIG. 4 is a partial end plan view of a second alternative bearing configuration between an alternataive rotating shaft of the rotating member and alternative flanges of the base.

Referring now to FIG. 4, a second alternative embodiment 60 of the remote control unit console of the present invention includes a central shaft 44 similar to that used in the first alternative embodiment 42, which fits within a V-shaped notch 62 having two angled ridges 64 defined by each of a pair of modified end flanges 66. When in its installed position, two of the six contact facets 45 defined by the central shaft 44 rest upon corresponding angled ridges 64 such that the central shaft fits snugly within the V-shaped notch 62. Therefore it may be seen that the second alternative embodiment of the central shaft 18 allows the rotating member to be positioned in six relatively stable positions. It may also be seen that the second alternative embodiment 60 provides more resistance to turning of the associated rotating member than the first alternative embodiment 42.

Although the rotating member 16 shown in the preferred embodiment has three mounting surfaces 30A, 30B, 30C, additional mounting surfaces could be provided about the circumferential surface of the rotating member while still remaining within the spirit and scope of the present invention, provided the mounting surface areas are large enough to support conventional remote control units. For example, a rotating member 16 having a square transverse cross section would provide four mounting surfaces. Indeed, any number of mounting surfaces could be provided, with the only consideration being the resulting size of the rotating member 16.

Similarly, a central shaft of the alternative embodiment having greater or lesser number of contact facets 45 may be provided without departing from the spirit and scope of the present invention. For example, if the previously-discussed rotating member having four mounting surfaces is used, a central shaft having eight contact facets could be used.

As previously discussed, a "Velcro"-type connection is provided between each remote control unit and the rotating member 16 to provide a selectively attachable configuration. Alternatively, a plurality of rubber bands (not shown) may be provided which encircle the rotating member 16 and the remote control units, such that the remote control units are maintained in a biased relationship on the support surfaces of the rotating member. Other releasable or permanent means for attaching the units to the rotating member could be provided.

The central shaft 18 is preferably composed of steel, although any material having structurally similar properties could be used. The base 12, rotating member 16 and central shaft 18 may be composed of any rigid structural material such as wood, plastic, or metal. The preferred embodiment utilizes a sheetlike plastic material such as that associated with the "Plexiglas" trademark, for construction of the base 12 and the rotating member 16. The particular shapes of the base 12 and the rotating member 16 can be formed by heat treating and forming the plastic sheet material by means known in the art.

The present invention solves problems in the prior art by providing a remote control unit console which allows a plurality of units to be centrally stored and operated without removal from the console. The device is simple in construction and therefore may be produced at a low cost, and is also simple in operation, as all remote control units are easily accessed and operated for great convenience to the operator.

While this invention has been described in specific detail with particular reference to the disclosed embodiments, it will be understood that many variations and modifications can be effected within the spirit and scope of the appended claims.

I claim:

1. A device for supporting remote control units which emit activating beams, comprising:
   a base;
   a remote control unit mount rotatably mounted about a first axis relative to said base, including means for supporting a plurality of remote control units; and
   connecting means operably associated with said base and said remote control unit mount so that said remote control unit mount may be rotated about said axis relative to said base so that said remote control units may be selectively activated to emit triggering beams along axes substantially parallel to said first axis without movement of said base.

2. The device as claimed in claim 1, wherein said connecting means includes a shaft extending from said remote control unit mount and rotatably mounted to said base along said axis.

3. The device as claimed in claim 2, further comprising means for retaining said remote control unit mount in a selected orientation with respect to said base.

4. The device as claimed in claim 3, wherein said retaining means comprises a clutch intermediate said remote control unit mount and said base.

5. The device as claimed in claim 1, wherein said remote control units are supported in a spaced-apart relationship such that said activating beams of said remote control unit are commonly oriented.

6. The device as claimed in claim 1, wherein said remote control units are supported in a spaced-apart relationship such that said activating beams are commonly oriented and substantially parallel to said axis.

7. The device as claimed in claim 1, such that said remote control unit mount is rotatably mounted relative to said base such that said remote control mount may rotate 360 degrees about such axis.

8. A device for supporting remote control units which emit activating beams, comprising:
   a base having a pair of commonly disposed support members each including a bearing; and
   an elongate remote control unit mount having each end rotatably mounted within one of said bearings about an axis, and defining three substantially planar surfaces each for detachably supporting a corresponding remote control unit, such that said activating beam of each of said unit may be directed along a path substantially parallel to said axis;
   such that said remote control unit mount may be pivoted about said axis, and said remote control units may be selectively activated to emit activating beams toward a common remote position substantially along said axis, without movement of said base.

9. A device for supporting remote control units which emit activating beams, comprising:
   a base defining a horizontal edge;
   a remote control unit mount rotatably mounted about an axis relative to said base, including means for supporting a plurality of remote control units;
   a shaft extending from said remote control unit mount and rotatably mounted to said base along said axis, so that said remote control unit mount may be rotated about said axis relative to said base and so that said remote control units may be selectively activated to emit activating beams toward a common remote position without movement of said base, said shaft including a portion defining a plurality of facets,
   wherein said remote control unit may be retained in a selected orientation with respect to said base by said facets resting upon said horizontal edge.

10. A device for supporting remote control units which emit activating beams, comprising:
    a base;
    a remote control unit mount rotatably mounted about an axis relative to said base, said mount including a plurality of mounting surfaces intersecting along parallel lines, said mounting surfaces for supporting a corresponding plurality of remote control units in a spaced-apart relationship such that said beams of said remote control units are commonly oriented; and connecting means operably associated with said base and said remote control unit mount so that said remote control unit mount may be rotated about said axis relative to said base so that said remote control units may be selectively activated to emit activating beams toward a common remote position without movement of said base.

11. A device for supporting remote control units which emit activating beams, comprising:

a base;

a remote control unit mount rotatably mounted about an axis relative to said base, said mount including a plurality of mounting surfaces intersecting along parallel lines for supporting a corresponding plurality of remote control units; and connecting means operably associated with said base and said remote control unit mount so that said remote control unit mount may be rotated about said axis relative to said base so that said remote control units may be selectively activated to emit triggering beams toward a common remote position without movement of said base.

12. The device as claimed in claim 11, wherein said parallel lines are parallel to said axis.

13. The device as claimed in claim 11, wherein said connecting means includes a shaft extending from said mount and rotatably mounted to said base along said axis.

14. The device as claimed in claim 13, wherein said plurality of mounting surfaces is three in number.

15. A device for supporting remote control units which emit activating beams, comprising:

a base having a pair of commonly disposed members each including a bearing;

an elongate remote control unit mount having each end rotatably mounted within one of said bearings about an axis, and defining a plurality of substantially planar surfaces each for detachably supporting a corresponding remote control unit, such that said activating beam of said unit may be directed along a path substantially parallel to said axis;

such that said remote control unit mount may be pivoted about said axis, and said remote control units may be selectively activated to emit activating beams toward a common remote position substantially along said axis, without movement of said base.

* * * * *